US006759858B2

United States Patent
Roggel

(10) Patent No.: US 6,759,858 B2
(45) Date of Patent: *Jul. 6, 2004

(54) INTEGRATED CIRCUIT TEST PROBE HAVING RIDGE CONTACT

(75) Inventor: Amir Roggel, Rehovot (IL)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/421,210

(22) Filed: Oct. 20, 1999

(65) Prior Publication Data

US 2002/0017914 A1 Feb. 14, 2002

(51) Int. Cl.$^7$ .......................... G01R 31/02; G01R 27/08
(52) U.S. Cl. ....................... 324/754; 324/761; 324/755; 324/765; 324/724; 324/762
(58) Field of Search .................. 324/754, 761, 324/755, 765, 724, 762, 758; 439/482; 29/842, 844, 825; 257/739

(56) References Cited

U.S. PATENT DOCUMENTS

| | | | | |
|---|---|---|---|---|
| 3,611,128 A | * | 10/1971 | Nagata | 324/72.5 |
| 3,996,516 A | * | 12/1976 | Luther | 324/761 |
| 4,001,685 A | * | 1/1977 | Roch | 324/762 |
| 4,034,293 A | * | 7/1977 | Roch | 324/762 |
| 4,161,692 A | * | 7/1979 | Tarzwell | 324/754 |
| 4,195,259 A | * | 3/1980 | Reid et al. | 324/754 |
| 4,468,615 A | * | 8/1984 | Jamet et al. | 324/754 |
| 4,937,653 A | * | 6/1990 | Blonder et al. | 257/739 |
| 4,954,458 A | * | 9/1990 | Reid | 438/109 |
| 4,965,865 A | * | 10/1990 | Trenary | 324/754 |
| 5,113,133 A | * | 5/1992 | Conti et al. | 324/754 |
| 5,323,035 A | * | 6/1994 | Leedy | 438/479 |
| 5,326,428 A | * | 7/1994 | Farnworth et al. | 324/724 |
| 5,367,165 A | * | 11/1994 | Toda et al. | 250/306 |
| 5,546,405 A | * | 8/1996 | Golla | 714/724 |
| 5,559,444 A | * | 9/1996 | Farnworth et al. | 324/754 |
| 5,731,710 A | * | 3/1998 | Mizuno et al. | 324/761 |
| 5,763,879 A | * | 6/1998 | Zimmer et al. | 250/306 |
| 5,821,763 A | * | 10/1998 | Beaman et al. | 324/754 |
| 6,016,060 A | * | 1/2000 | Akram et al. | 324/757 |
| 6,037,786 A | * | 3/2000 | Palagonia | 324/654 |
| 6,206,273 B1 | * | 3/2001 | Beaman et al. | 228/180.5 |
| 6,256,882 B1 | * | 7/2001 | Gleason et al. | 29/874 |
| 6,362,637 B2 | * | 3/2002 | Farnworth et al. | 324/755 |
| 6,414,506 B2 | * | 7/2002 | Akram et al. | 324/765 |

OTHER PUBLICATIONS

Merriam–Wesster's College Dictionary, Tenth Edition., 1998.*
Walker, Chambers Dictionary of Science and Technology, general edition, 1999.*

* cited by examiner

Primary Examiner—Andrew H. Hirshfeld
Assistant Examiner—Wasseem H. Hamdan
(74) Attorney, Agent, or Firm—Schwegman, Lundberg, Woessner & Kluth, P.A.

(57) ABSTRACT

An integrated circuit die test probe has a non-flat tip. In one embodiment, the tip has an elongated pyramid shape that provides a cutting action while probing solder covered conductive pads. The tip shape helps maintain a uniform tip to pad resistance during testing by penetrating the solder layer and avoiding solder residue build up. The test probes significantly reduce the need for cleaning the probe tips to remove residue.

20 Claims, 3 Drawing Sheets

INTEGRATED CIRCUIT TEST PROBE HAVING RIDGE CONTACT

TECHNICAL FIELD OF THE INVENTION

The present invention relates generally to integrated circuits and in particular the present invention relates to electrical probes used to test integrated circuits.

BACKGROUND OF THE INVENTION

Integrated circuits are typically fabricated in a wafer of dies. Each die includes complex circuitry that will be separated from the die and further processed to allow for external electrical communication interconnects to the die. Because the die are complex, defects contained in the individual die can be severe and result in a die that is either scrap or requires some type of repair.

Further processing of a die which contains a severe defect can result in the loss of economic resources. That is, the cost of packaging a defective die is an unnecessary loss. A process of testing the integrated circuit die prior to packaging, therefore, is typically performed to identify die that should not be further processed. This test is commonly referred to as wafer probe test, or die test. During a probe test a number of electrically conductive probes are placed in contact with conductive locations on the die. A relatively complete electrical testing can be conducted using the electrical probes.

Traditional integrated circuit die were packaged using wire bonds to couple the electrical connections of the die to the external circuit environment. As such, wire bond pads were located along a periphery of the circuit die and test probes could approach the die from an angled position. The angled approach assisted in "scratching" the test probe on the wire bond pads. The scratching action helped to break through any oxide layer which may have formed on the conductive layer. A lower resistance contact, therefore, could be provided between the probe and the conductive pad if the oxide layer were penetrated.

Changes in integrated circuit packaging techniques have resulted in the distribution of conductive pads over the surface of the integrated circuit die. For example, packaging techniques which use solder ball bonds to couple the die to a circuit board allow for the distribution of the conductive pads. In such techniques, a new solder bump structure is added on top of the pad to prepare it for packaging. As a result, test probes cannot approach a die from an angled position, but approach the die from a more vertical position. A layer of oxide located over the conductive bump, therefore, can increase a resistance between the pad and the probe than that experienced with prior generations of integrated circuit die. Further, pads which are covered in solder can create difficulties in probing.

For the reasons stated above, and for other reasons stated below which will become apparent to those skilled in the art upon reading and understanding the present specification, there is a need in the art for an integrated circuit probe which provides a reliable contact during probe operations.

SUMMARY OF THE INVENTION

In one embodiment, an integrated circuit test probe comprises a probe shaft, and a downwardly extending probe tip attached to a bottom end of the probe shaft. The probe tip has an elongated pyramid shape.

In another embodiment, an integrated circuit test probe comprises a probe shaft, and a downwardly extending probe tip attached to a bottom end of the probe shaft. The probe tip has a blade-shape and comprises first, second, third and fourth downwardly extending sides, the first, second, third and fourth downwardly extending sides are connected on a downward edge to form a blade ridge.

A method of testing an integrated circuit die is provided in one embodiment. The method comprises lowering a test probe onto a conductive pad located on the integrated circuit die, where a top surface of the conductive pad is covered with a layer of solder. The test probe comprises a probe shaft having an elbow, and a downwardly extending probe tip attached to a bottom end of the probe shaft, the probe tip has an elongated pyramid shape. A downward force is applied on the probe shaft, and the probe shaft is deflected such that a horizontal force is applied to the probe tip to create a cutting action between the probe tip and the layer of solder to penetrate the solder layer with the probe tip.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

As stated above, integrated circuit die are tested prior to packaging to identify die which may be defective. If a defective die is detected, further processing expenses can be avoided. Integrated circuit die mounting techniques have evolved to allow for the distribution of mounting pads over the surface of the integrated circuit. These techniques often include the use of solder bumps formed on the conductive pads. The die can include solder located on the pads prior to performing a probe test. A layer of oxide on top of solder bumps can increase the resistance between the probe and the conductive bumps. The amount of resistance is typically influenced most by the surface of the solder. A probe that penetrates the solder surface, therefore, can have a lower resistance contact with the bumps.

Figure 1:
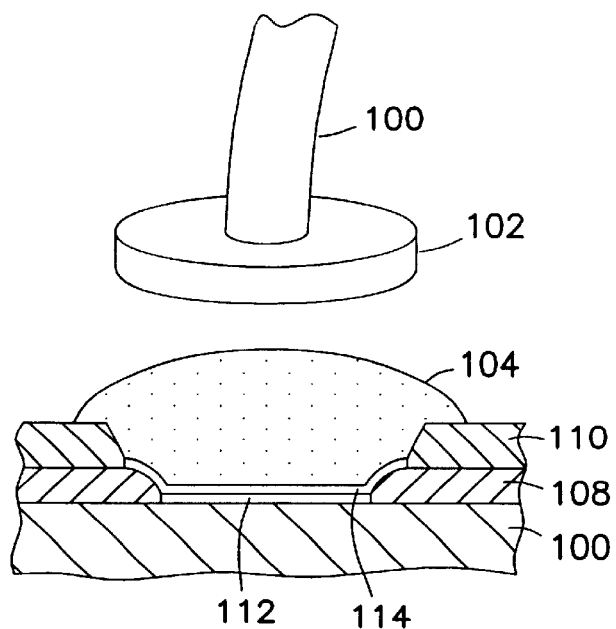
FIG. 1 is a prior art flat tip test probe.

FIG. 1 illustrates an example prior art probe 100 used to test an integrated circuit die. The integrated circuit die includes a conductive bump 104 which has a generally mushroom top shape which is formed by a structure of solder plated on a metal layer 114. The integrated circuit includes a base layer 100, such as silicon, with multiple layers of material 108 and 110 which define specific structures and openings. A desired contact region 112 is exposed through the multiple layers such that a layer of metal 114 can be provided on top of the contact region. The solder is then provided in the opening of layer 110 and on top of the metal layer 114. The specific method described to fabricate the solder bump is intended to be an example of one method of forming solder bumps, and other methods can be used without departing from the present invention.

The probe includes a tip 102 which is used to make an electrical connection with the solder. The probe tip has a generally flat surface that is placed in contact with the solder. As explained, it is desired to penetrate the surface of the solder to form a reliable connection for testing. Variations in the probe to pad resistance can create erroneous data during testing. By adding a slight horizontal movement to the probe while making contact with the pad, the surface of the solder can be broken by the probe tip. The probe tip, however, accumulates solder oxidized residue over time. This oxidized solder residue can increase the probe tip resistance and create erroneous test data. As a result, the test probes must be periodically cleaned to remove any solder residue.

Figure 2:
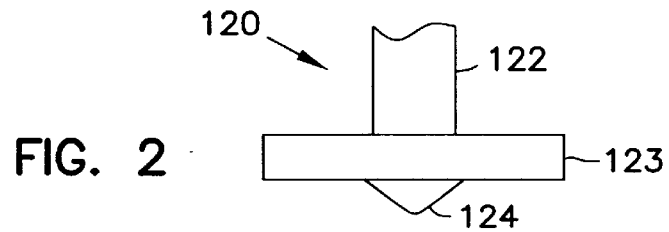
FIG. 2 is a side view of a test probe according to one embodiment of the present invention.
Figure 3:
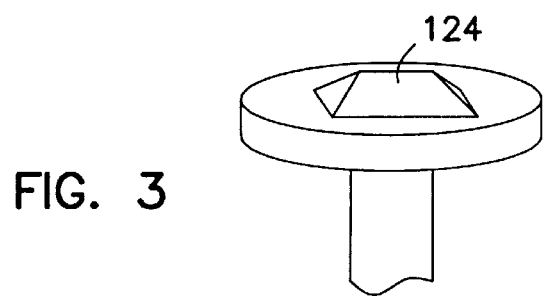
FIG. 3 is a bottom perspective view of one embodiment of the present invention.
Figure 4A:
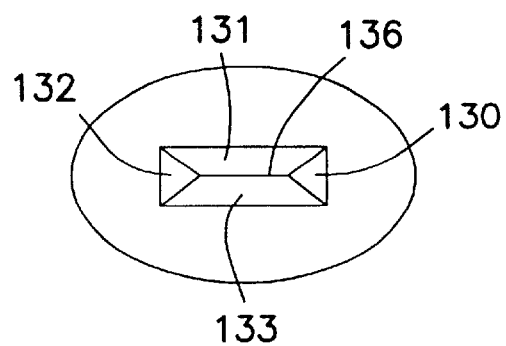
FIG. 4A is a bottom view of one embodiment of the present invention.
Figure 4B:
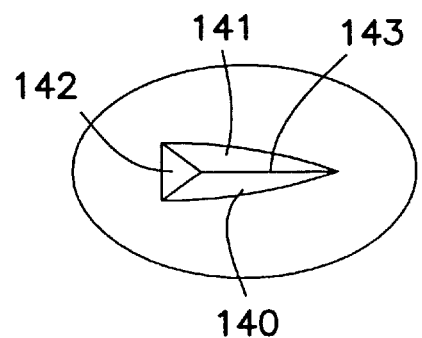
FIG. 4B is a bottom view of another embodiment of the present invention.
Figure 4C:
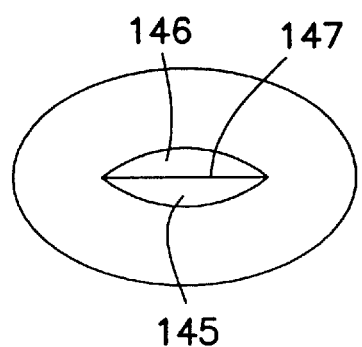
FIG. 4C is a bottom view of another embodiment of the present invention.

Referring to FIG. 2 a probe according to the present invention is illustrated. The probe 120 includes a probe shaft 122 and a tip 124 which is attached to a bottom end of the shaft. The probe tip is shaped with a pointed surface. The tip is illustrated in FIG. 3 to show the tip as an elongated pyramid. The pyramid shape illustrated has four defined sides, however, the shape can be modified to have three or two sides and still maintain a shape having a ridge. These tips can also be called "blade" tips. The tip downwardly extends from the shaft. The tip can include a circular plate, or base, 123 which provides a secure connection to the shaft. FIG. 4A illustrates a bottom view of the blade tip having four sides. The tip illustrated is one embodiment of a tip according to the present invention. The tip includes four sides, 130, 131, 132 and 134. The four sides form a center ridge, or blade, 136. The height of the tip from plate 123 to the ridge can be selected for the type of pad/solder being tested. In one embodiment, the tip height is about 1.5 mil. FIG. 4B illustrates a bottom view of a blade tip having three sides 140, 141 and 142. The three sides form a ridge 143. FIG. 4C illustrates a bottom view of a blade tip having two sides 145 and 146 which form a ridge 147.

Figure 5:
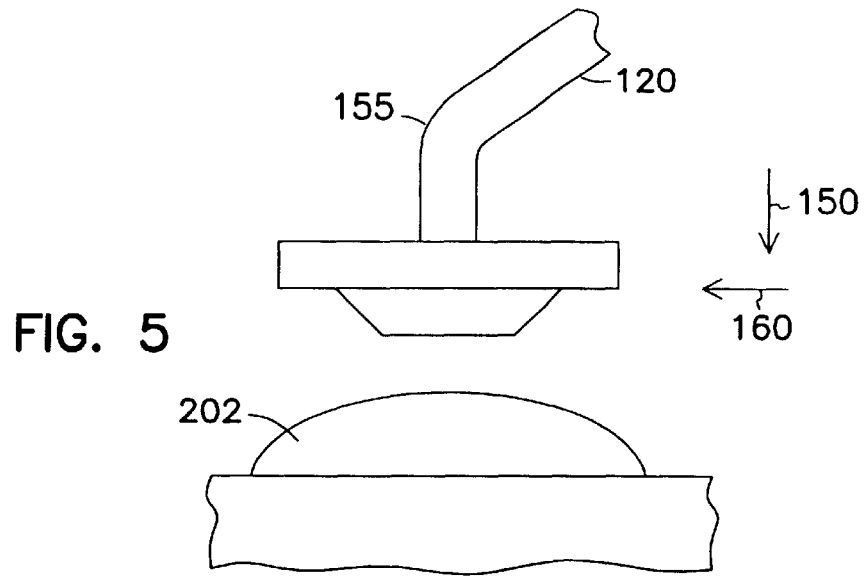
FIG. 5 is a side view of a test probe as applied to an integrated circuit conductive bump.
Figure 6:
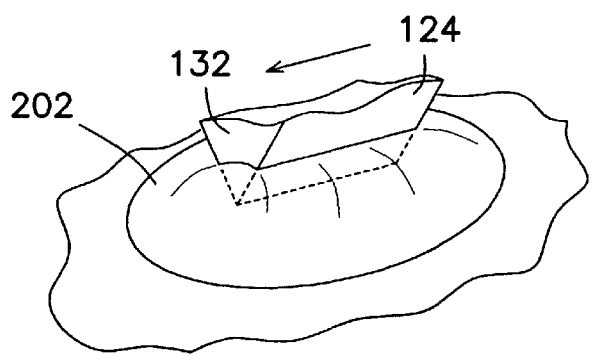
FIG. 6 is a more detailed illustration of a test probe as applied to an integrated circuit conductive bump.

In operation, as illustrated in FIG. 5, probe 120 is lowered in a vertical direction 150 onto a solder bump 202. The probe tip is then moved in a horizontal direction 160 to assist in penetrating the solder. In one embodiment, the shaft includes at least one slight elbow 155. This bend provides the horizontal movement to the blade tip as the probe is forced in the vertical direction. That is, the shaft will deflect slightly at the elbow to move the tip in direction 160. The horizontal movement is directed along the central line of the probe tip as defined by ridge 136 and the movement is about 0.5–1.5 mil in length. This movement "cuts" into the solder to provide a reduced resistance contact between the probe and the solder/conductive bump. As illustrated in FIG. 6, the tip creates a small groove in the solder layer. To improve the penetration action, the leading edge 132 of the probe tip can be either rounded or formed with a point.

Figure 7:
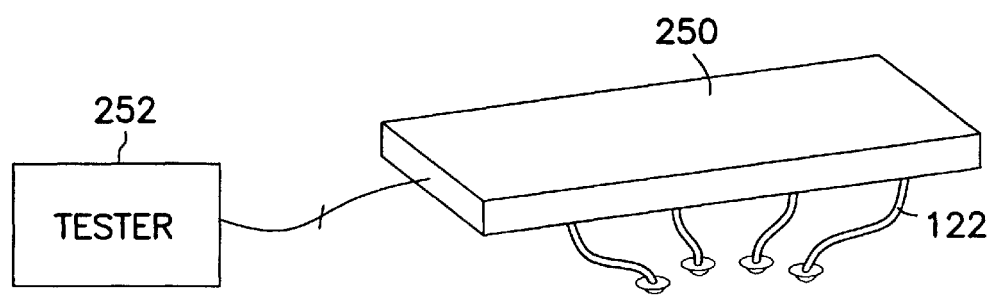
FIG. 7 provides a simplified illustration of a tester and probe card according to the present invention.

FIG. 7 illustrates a simplified probe card 250 coupled to a tester 252. The probe card includes numerous probes 122 which are custom designed for the layout and specifications of the integrated circuit die that is to be tested with the probe card. About 1500 probes are included in a probe card for a "typical" microprocessor die. The next generation of high speed processors may push the envelope to 2000 and 3000 probes per card.

The 'blade' tip shape provides several benefits over the traditional "flat" tip. The term flat is used herein to refer to tips with a flat or slightly convex surface. First, the shape of the probe tip reduces solder residue buildup on the probe tip. That is, the blade shape cuts into the solder and allows the solder to effectively slide along sides 131 and 133 of the tip without creating a residue buildup. As such, expensive and time consuming tip cleaning is reduced, if not eliminated. Second, the tip increases solder penetration to provide a more consistent contact resistance while testing numerous integrated circuit die.

CONCLUSION

An integrated circuit die test probe has been described which has a non-flat tip. In one embodiment, the tip has an elongated pyramid shape that provides a cutting action while probing solder covered conductive pads. The tip shape helps maintain a uniform tip to bump resistance during testing by penetrating the solder layer and avoiding solder residue build up. The test probes significantly reduce the need for cleaning the probe tips to remove residue.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit test probe comprising:
   a probe shaft; and
   a downwardly extending probe tip attached to a bottom end of the probe shaft, the probe tip having a blade adapted for cutting a solder bump with a sliding action, wherein the probe shaft includes an elbow to provide a horizontal movement of the probe tip in response to a downward force applied to the probe shaft.

2. The integrated circuit test probe of claim 1 wherein the probe tip has a central ridge formed by a number of sides selected from the group comprising either two, three and four.

3. The integrated circuit test probe of claim 1 wherein the downwardly extending probe tip has a height of approximately 1.5 mil.

4. An integrated circuit test probe comprising:
   a probe shaft; and
   a downwardly extending probe tip attached to a bottom end of the probe shaft, the probe tip has a blade-shape and comprises first, second, third and fourth downwardly extending sides, the first, second, third and fourth downwardly extending sides are connected on a downward edge to form a blade ridge, wherein the probe shaft includes an elbow to provide a horizontal movement of the probe tip in response to a downward force applied to the probe shaft.

5. The integrated circuit test probe of claim 4 wherein the downwardly extending probe tip has a height of approximately 1.5 mil.

6. An integrated circuit test probe comprising:

a probe shaft; and a probe tip attached to a bottom end of the probe shaft, the probe tip comprises, a circular base, and a blade-shaped structure downwardly extending from the base, the blade-shaped structure comprises first, second, third and fourth downwardly extending sides, the first, second, third and fourth downwardly extending sides are connected on a downward edge to form a blade ridge, wherein the probe shaft includes an elbow to provide a horizontal movement of the probe tip in response to a downward force applied to the probe shaft.

7. An integrated circuit die probe test card comprising:

a plurality of test probes, each of the test probes comprises a probe shaft; and a downwardly extending probe tip attached to a bottom end of the probe shaft, the probe tip having a blade adapted for cutting a solder bump with a horizontal movement of the tip as the probe is forced in a vertical direction, wherein the probe shaft of each of the test probes includes an elbow to provide a horizontal movement of the probe tip in response to a downward force applied to the probe shaft.

8. The integrated circuit die probe test card of claim 7 wherein the plurality of test probes are electrically coupled to a tester for processing data via the plurality of test probes.

9. The integrated circuit die probe test card of claim 7 wherein the probe tip has a central ridge formed by a number of sides selected from the group comprising either two, three and four.

10. A method of testing an integrated circuit die, the method comprising:

lowering a test probe onto a conductive pad located on the integrated circuit die, a top surface of the conductive pad is covered with a layer of solder, the test probe comprises a probe shaft having an elbow, and a downwardly extending probe tip attached to a bottom end of the probe shaft, the probe tip having a blade;

applying a downward force on the probe shaft; and deflecting the probe shaft such that a horizontal force is applied to the probe tip to create a cutting action between the probe tip and the layer of solder to penetrate the solder layer with the probe tip.

11. The method of claim 10 wherein the probe tip has a central ridge formed by a number of sides selected from the group comprising either two, three and four.

12. A device comprising:

a probe tip having a ridge adapted for contacting a conductor, the ridge having a first axis; and a flexible shaft having a first end and a second end, wherein the first end is coupled to the probe tip and the second end is coupled to a fixture whereby a movement of the second end relative to the contact along a second axis in a direction of convergence brings the probe tip into communication with the contact and whereby further movement of the second end along the second axis results in displacement of the probe tip in a direction aligned with the first axis.

13. The device of claim 12 wherein the flexible shaft includes an elbow at a position between the first end and the second end.

14. The device of claim 12 wherein the flexible shaft includes an elbow having a first leg terminating at the first end and a second leg terminating at the second end.

15. The device of claim 14 wherein the first leg, the second leg and the first axis lie in a plane.

16. The device of claim 12 wherein the ridge includes a blade.

17. The device of claim 12 wherein the probe tip includes a base.

18. A method comprising:

converging a probe tip and an electrical contact along a first axis, said probe tip being attached to a probe shaft having an elbow;

applying a mating force to the probe tip and the electrical contact, by moving the probe shaft in a direction substantially aligned with the first axis; and translating the probe tip relative to the electrical contact in a direction substantially orthogonal to the first axis while the probe tip is in physical communication with the electrical contact by further movement of the probe shaft in said direction substantially aligned with the first axis.

19. The method of claim 18 wherein translating the probe tip includes cutting the electrical contact.

20. The method of claim 18 wherein translating the probe tip includes penetrating the electrical contact.

* * * * *